United States Patent [19]

Yoshida et al.

[11] Patent Number: 4,895,734
[45] Date of Patent: Jan. 23, 1990

[54] PROCESS FOR FORMING INSULATING FILM USED IN THIN FILM ELECTROLUMINESCENT DEVICE

[75] Inventors: Takeshi Yoshida; Masahiko Itabashi, both of Tsukuba, Japan

[73] Assignee: Hitachi Chemical Company, Ltd., Tokyo, Japan

[21] Appl. No.: 175,317

[22] Filed: Mar. 30, 1988

[30] Foreign Application Priority Data

Mar. 31, 1987 [JP] Japan ................................ 62-78099
Mar. 31, 1987 [JP] Japan ................................ 62-78100

[51] Int. Cl.$^4$ ............................................. B05D 3/06
[52] U.S. Cl. ........................................ 427/38; 427/77; 427/78; 427/99
[58] Field of Search ................ 427/38, 34, 77, 78, 427/99

[56] References Cited

U.S. PATENT DOCUMENTS

| | | | |
|---|---|---|---|
| 3,600,218 | 8/1971 | Pennebaker | 427/38 |
| 4,310,614 | 1/1982 | Connell et al. | 427/38 |
| 4,330,569 | 5/1982 | Gulett et al. | 427/38 |
| 4,436,770 | 3/1984 | Nishizawa et al. | 427/38 |
| 4,532,150 | 7/1985 | Endo et al. | 427/38 |
| 4,657,775 | 4/1987 | Shioiri et al. | 427/38 |
| 4,686,110 | 8/1987 | Endo et al. | 427/38 |
| 4,704,299 | 11/1987 | Wielonski et al. | 427/38 |

Primary Examiner—Stanley Silverman
Attorney, Agent, or Firm—Antonelli, Terry & Wands

[57] ABSTRACT

An insulating film formed by a plasma CVD method at the substrate temperature of 350° to 550° C.l is good in electric properties and heat resistance without causing whitening phenomenon is suitable for use in a thin-film electroluminescent device.

12 Claims, 1 Drawing Sheet

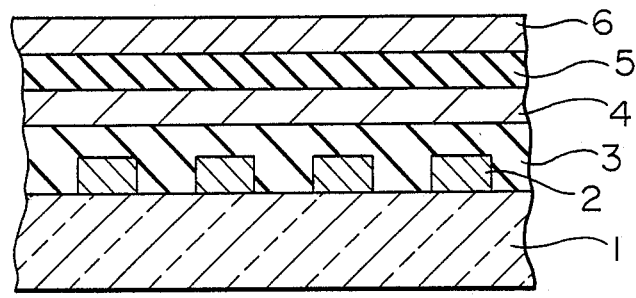

PROCESS FOR FORMING INSULATING FILM USED IN THIN FILM ELECTROLUMINESCENT DEVICE

BACKGROUND OF THE INVENTION

This invention relates to a process for forming an insulating film used in a luminescent device such as a thin-film electroluminescent device which takes out a light through a transparent electroconductive film and a receptor which takes in a light through a transparent electroconductive film formed on a transparent substrate, and a process for producing the thin-film electroluminescent device.

Thin-film electroluminescent devices which emit a light by applying an alternating electric field comprise an emission layer, a single or a plurality of insulating films formed on one side or both sides of the emission layer, and a pair of electrode layers at least one of which is transparent sandwiching the insulating films so as to emit electroluminescence with high brightness. The transparent electrode layer is usually formed on a transparent substrate such as a glass substrate. The thin-film electroluminescent device usually has a structure as shown in the attached drawing, wherein numeral 1 denotes a transparent substrate, numeral 2 denotes a transparent electrode, numeral 3 denotes a first insulating layer, numeral 4 denotes an emission layer, numeral 5 denotes a second insulating layer which is formed if necessary, and numeral 6 denotes a backside electrode.

As the first insulating layer, there is used at least one thin film of silicon nitride, silicon oxide and silicon oxynitride. Such a layer can be formed on a transparent electroconductive film formed on a transparent substrate such as a glass substrate by a vacuum deposition method, e.g. a resistance heating vacuum deposition method, an electron beam heating vacuum deposition, a sputtering method, or a plasma chemical vapor deposition (CVD) method.

According to the vacuum deposition method, the film produced has many pin holes and low resistance portions due to change in the composition, and in the case of applying an electric field between the transparent electrode (or electroconductive film) and the backside electrode (or electroconductive film) formed on the backside of the insulating film, a leak current passing through the insulating film increases, and at last dielectric breakdown takes place in the above-mentioned defect portions when the electric field is enlarged. Further, step coverage is worsened when projections or fine dusts are present in the transparent electroconductive film, or at side faces of the transparent electroconductive film on which a pattern is formed. As a result, there arise problems in that the above-mentioned insulating film is thinned at these portions, and the change in composition takes place so as to lower the electric resistance, which results in increasing the leak current and causing dielectric breakdown.

According to the sputtering method, the step coverage is better than the vacuum deposition method but still insufficient. Further, there are many problems in that the film forming time is long, the productivity is worse, and the transparent electroconductive film is damaged when exposed to high energy plasma to increase the electric resistance.

According to the plasma CVD method, the problems in the sputtering method can almost be solved, but there arise other problems in that cracks are formed in the insulating film or the insulating film is peeled off in a heating step after the film formation of the insulating film. This phenomenon takes place remarkably, when the heating temperature in the heating step after the film formation is higher or the film formation area is larger. According to the process disclosed in Japanese Patent Unexamined Publication No. 61-18889, two Si-N films are formed on an emission layer by a plasma CVD method using a gas mixture of $SiH_4$ and $N_2$, followed by using a different gas mixture of $SiH_4$ and $NH_3$, at the substrate temperature of 100 to 300° C. Since the emission layer has been formed after the formation of $SiO_2$ film and Si-N film by sputtering on a glass substrate having a transparent electrode thereon, there is no problem of causing cracks on the overlying Si-N films during the heating step after the film formation, but the plasma CVD method employed therein is too complicated and lacks in productivity. In addition, according to the plasma CVD method, the resulting insulating film sometimes becomes opaque due to non-uniform film wherein the leak electric current becomes abnormally large.

SUMMARY OF THE INVENTION

It is an object of this invention to provide a process for forming a transparent and uniform insulating film used in a luminescent device, excellent in insulating properties (the step coverage) and bearable in a heating step after the film formation with high productivity.

It is another object of this invention to provide a process for producing a thin-film electroluminescent device without causing dielectric breakdown and good in taking out efficiency of light.

This invention provides a process for forming an insulating film which comprises vapor depositing a thin film of at least one member selected from the group consisting of silicon nitride, silicon oxide and silicon oxynitride on a transparent electroconductive film formed on a transparent substrate by a plasma chemical vapor deposition method with heating the transparent substrate at 350 to 550° C.

This invention also provides a process for producing a thin-film electroluminescent device which comprises forming a first insulating film of at least one member selected from the group consisting of silicon nitride, silicon oxide and silicon oxynitride on transparent electrodes formed on a transparent substrate by a plasma chemical vapor deposition method with heating the transparent substrate at 350 to 550° C., forming an emission layer on the first insulating layer, forming a second insulating film on the emission layer, if necessary, and forming backside electrodes thereon.

BRIEF DESCRIPTION OF THE DRAWING

The attached drawing is a cross-sectional view of one example of a thin-film electroluminescent device.

DESCRIPTION OF THE PREFERRED EMBODIMENTS

The plasma CVD (chemical vapor deposition) method is a vapor deposition method wherein at least one gas of a compound or a single body of elements constituting a thin film to be formed is exposed to plasma discharge to activate and to bring about a reaction in a gas phase or on the surface of a substrate at a temperature lower than the case of using heat to form the desired thin film.

Generally speaking, the plasma CVD method is characterized by low-temperature vapor deposition using plasma at a substrate temperature of 200 to 300° C. In contrast, in this invention, the substrate temperature is raised to 350 to 550° C. When the substrate temperature is raised, thermal CVD easily takes place to bring about various side reactions. Therefore, it becomes difficult to control the temperature. Thus, the substrate temperature of 380 to 420° C. is more preferable to conduct the film formation without bringing about troubles caused by the thermal CVD and to give the uniform film.

The resulting vapor deposited film is not cracked nor peeled off, even if heated at 550° C. in the heat treating step after the film formation. The same good results can be obtained even if the substrate has an area of 100 cm$^2$ or more.

On the other hand, when the substrate temperature is lower than 350° C., there take place cracks and peeling of the insulating film in the heat treating step. When the substrate temperature is higher than 550° C., insulating substance particles formed by the thermal CVD at a gas introducing inlet or a hot plate adhere to the substrate undesirably. Further, when the substrate is cooled to room temperature after the vapor deposition, there take place peeling of the film and cracks on the film, particularly remarkably in the neighborhood of the abovementioned adhesion. Therefore, the substrate temperature range for obtaining the good insulating film is very narrow. In order to carry out the plasma CVD method effectively, it is preferable to conduct the vapor deposition 10 times or less continuously and to clean the gas introducing inlet with a sandblast or the like.

The transparent substrate temperature of 350 to 550° C. can be maintained by controlling the temperature of a metal plate of about 2 to 50 mm thick for tightly fixing the transparent substrate of about 0.3 to 5 mm thick at 350 to 550° C. In the case of heating the transparent substrate surface by radiation heat, the temperature can be controlled by measuring the substrate surface temperature by a thermocouple.

As the kinds of gases in the formation of thin film of silicon nitride, silicon oxide or silicon oxynitride by the plasma CVD method, there can be used hydrogenated compounds such as $SiH_4$, $Si_2H_6$, etc., and halides such as $SiF_4$, $SiCe_4$, etc., as a silicon source; $NH_3$, $N_2$, etc., as a nitrogen source, $N_2O$, $O_2$, etc., as an oxygen source, and $N_2$, Ar, etc., as a diluent gas. As to the Si/N volume ratio, it is preferable to use 0.5 to 80 parts of the silicon source gas to 100 parts of the nitrogen source gas. As to the Si/O volume ratio, it is preferable to use 20 to 300 parts of the silicon source gas to 100 parts of the oxygen source gas.

It is preferable to make the total gas pressure 0.1 to 5 Torr, the applied electric power 0.05 to 10 W/cm$^2$, and the frequency 10 KH$_z$ to 50 GH$_z$.

The thickness of thin film of silicon nitride, silicon oxide or silicon oxynitride formed by the plasma CVD method is preferably 0.1 to 3 $\mu$m.

As the transparent substrate, it is preferable to use a glass plate.

As the transparent electroconductive film, there can be used oxide semiconductor films of $In_2O_3(Sn)$, $SnO_2(Sb)$, $SnO_2(P)$, $SnO_2(Te)$, $SnO_2(W)$, $SnO_2(Ce)$, $SnO_2(F)$, $Cd_2SnO_4$, $CdSnO_2$, CdO, etc.; and films of metals such as Au, Ag, Cu, Pd, Pt, A(, Cr, Rh, etc. It is preferable to use the oxide semiconductor film or metal film having a linear thermal expansion coefficient two to several times as large as that of the insulating film of silicon nitride, silicon oxide or silicon oxynitride formed thereon. Further, when silicon nitride, silicon oxide or silicon oxynitride is vapor deposited by the plasma CVD method, since tensile stress is generally retained in the resulting film as residual stress, the apparent thermal expansion coefficient becomes by far smaller. From this point, the peeling of the insulating film and cracks on the insulating film easily take place in the heat treating step after the film formation.

But such an undesirable phenomenon does not take place in the present invention, since the substrate temperature of 350 to 550° C. is employed in the vapor deposition of insulating film of silicon nitride, silicon oxide, or silicon oxynitride by the plasma CVD method. Further, in the present invention, no peeling of the insulating film and no cracks on the insulating film do not take place in the later heat treating step, even if the total area of the transparent electroconductive film is 5 cm$^2$ or more.

The shape of the transparent electroconductive film is not limited and can be stripe-like (to form electrodes) or one sheet covering the whole surface of the transparent substrate.

In the insulating film of silicon nitride, silicon oxide or silicon oxynitride formed by the plasma CVD method, there often takes place a whitening phenomenon (becoming opaque). The observation by an electron microscope reveals that particles with abnormal particle sizes grow on the transparent electroconductive film so as to to prevent uniform growth of the insulating film. This phenomenon often takes place when the transparent electroconductive film is cleaned sufficiently. Further, this reaction seems to take place almost on the surface of the transparent electroconductive film. The higher the substrate temperature becomes, the more often the whitening phenomenon takes place. This seems to be that the abovementioned reaction is accelerated, but a cause for growing the particles is not clear.

In order to prevent the whitening phenomenon, it is preferable to subject the transparent substrate to an oxygen plasma pre-treatment in the plasma CVD chamber under the conditions of an oxygen partial pressure of 0.05 to 1.0 Torr, an applied electric power of 0.05 to 1 W/cm$^2$ with respect to the electrode area depending on an apparatus used, a substrate temperature of 200 to 550° C. and a treating time of several minutes. The same effect can be admitted when a nitrogen gas, an argon gas or the like inert gas is used in place of the oxygen gas, but its degree is slightly inferior to the oxygen plasma pretreatment. Therefore, it is preferable to replace the oxygen gas by nitrogen or inert gas when there is used a substance which is to be damaged by the oxygen plasma on the same substrate.

It is also possible to prevent the whitening phenomenon by vapor depositing the transparent electroconductive film with an insulating material in 1 to 10 Å thickness. In this case, the insulating material covers the transparent substrate not uniformly but partially to form an insular structure. As the insulating material, there can be used silicon nitride, silicon oxide, silicon oxynitride, $Ae_2O_3$, etc. For example, when a silicon nitride film is formed as the insulating film by the plasma CVD method, the substrate is first vapor deposited with silicon nitride in about several Å by the plasma CVD method, and the applied power is cut once, followed by the formation of the silicon nitride insulating film with the predetermined thickness. When Ae$_2$O$_3$ is vapor deposited by the plasma CVD method, the thickness of about 3 to 10 Å is preferable.

According to the present invention, there can be obtained an insulating film of silicon nitride, silicon oxide or silicon oxynitride with good electric properties and heat resistance (withstanding the succeeding heat treatment) without causing the whitening phenomenon with good productivity.

Further, the insulating film formed by the present invention can be applied to luminescent devices which take out a light via a transparent electroconductive film and receptors which take in a light via a transparent electroconductive film.

The formation of insulating film is illustrated by way of the following Examples.

EXAMPLE 1

A film of In$_2$O$_3$(Sn) of about 2000 Å was formed on a borosilicate glass plate by an electron beam heating vacuum deposition method, followed by stripe-like etching to give a substrate. The substrate was cleaned and placed on the lower side electrode in a plasma CVD apparatus. The substrate temperature was made 400° C. and the pressure
in a chamber was reduced to $5 \times 10^{-6}$ Torr. Then SiH$_4$, N$_2$ and NH$_3$ were introduced into the chamber at a volume ratio of 1 : 7 : 2 to make the total pressure 0.8 Torr. The vapor deposition of silicon nitride was carried out at applied electric power of 0.18 W/cm$^2$ for about 5 minutes. The resulting silicon nitride film was transparent, about 3000 Å in thickness, and low in the leak electric current ($10^{-3}$ $\mu$A/mm$^2$ at direct current electric voltage of 100 V) and showed no dielectric breakdown even if an electric field of $1.0 \times 10^7$ V/cm was applied.

EXAMPLE 2

In the same manner as described in Example 1, SiH$_4$ and N$_2$O were introduced at a volume ratio of 25 : 75 to make the total pressure in the chamber 0.8 Torr. A transparent silicon oxide film with a film thickness of about 3000 Å was vapor deposited at the substrate temperature of 410° C. at the applied electric power of 0.06 W/cm$^2$ for about 1.5 minutes. The leak electric current was $10^{-4}$ $\mu$A/mm$^2$ at direct current electric voltage of 100 V and no dielectric breakdown was observed even if an electric field of $7.0 \times 10^6$ V/cm was applied.

EXAMPLE 3

In the same manner as described in Example 1, SiH$_4$, N$_2$, NH$_3$ and N$_2$O were introduced into the chamber at a volume ratio of 9 : 17 : 70 : 4. Silicon oxynitride was vapor deposited at the substrate temperature of 390° C., and applied electric power of 0.1 W/cm$^2$ for about 10 minutes. The resulting film had a film thickness of about 3000 Å, and showed a leak electric current of $10^{-5}$ $\mu$A/mm$^2$ at direct current electric voltage of 100 V and no dielectric breakdown even if an electric field of $1.0 \times 10^7$ V/cm was applied.

EXAMPLE 4

In the same manner as described in Example 1, a substrate was placed in the chamber and made the substrate temperature 400° C. After the pressure was reduced to $1.5 \times 10^{-6}$ Torr, oxygen was introduced into the chamber to make the pressure in the chamber 0.15 Torr. After oxygen plasma treatment for about 3 minutes by applying an electric power of 0.2 W/cm$^2$, silicon nitride, silicon oxide or silicon oxynitride was vapor deposited in the same manner as described in Examples 1 to 3. By conducting this treatment, no whitening phenomenon which had been occurred often was admitted with no change in electric properties.

When the oxygen gas was replaced by a nitrogen gas, no whitening phenomenon was observed but the electric properties was worsened by about 5%, which value is negligible in practical use.

EXAMPLE 5

The same substrate as used in Example 1 was vapor deposited with Ae$_2$O$_3$ for about 3 seconds (monitor conversion 5 Å) by an electron beam heating vacuum deposition method. Then, an insulating film was formed in the same manner as described in Examples 1 to 3. The gas composition and the applied electric power were made the same as those of Examples 1 to 3, and after making the plasma for about 2 seconds, the film formation was conducted in the same manner as described in Examples 1 to 3.

By the above-mentioned pre-treatment, no whitening phenomenon was admitted and the electric properties were as excellent as in the case of nitrogen plasma treatment.

A thin-film electroluminescent device can be produced by using the insulating film obtained by the above-mentioned process as explained below.

A thin-film electroluminescent device can be produced by forming a first insulating film of at least one of silicon nitride, silicon oxide and silicon oxynitride by a plasma CVD method at the substrate temperature of 350 to 550° C. on a transparent substrate having transparent electrodes (or a transparent electroconductive layer) thereon, forming an emission layer on the first insulating layer, forming a second insulating layer on the emission layer, if necessary, and forming backside electrodes thereon.

As the transparent substrate, the use of a glass plate is preferable.

As the transparent electrodes formed on the transparent substrate, there can be used oxide semiconductor films of In$_2$O$_3$(Sn), SnO$_2$(Sb), SnO$_2$(P), SnO$_2$(Te), SnO$_2$(W), SnO$_2$(Ce), SnO$_2$(F), Cd$_2$SnO$_4$, CdSnO$_2$, CdO, ZnO(Ae), etc.; films of a metal such as Au, Ag, Cu, Pd, Pt, Ae, Cr, Rh, etc. It is preferable to use stripe-like transparent electrodes.

The transparent electrodes can be formed by a vacuum deposition method, or a sputtering method. When the thickness is 0.1 to 1 $\mu$m, the sheet resistance becomes about 10 Ω. After forming an electroconductive film to be formed into transparent electrodes on the whole surface of the transparent substrate, etching is conducted by a photolithographic method to form stripe-like electrodes. As the etching solution, there can be used a solution mainly containing ferric chloride, a solution obtained by diluting concentrated hydrochloric acid with the same volume of water, or the like.

The emission layer can be formed by vapor depositing a substance obtained by doping an luminescent center such as Mn to a compound of elements of group II to VI of the periodic table. The thickness of the emission layer is preferably 0.1 to 3 $\mu$m.

The thickness of the first insulating film is about 0.1 to 3 $\mu$m. The formation of the first insulating film by the plasma CVD method is explained above.

The second insulating film, which is formed if necessary, can be formed in the same manner as mentioned in the first insulating film. In addition, $Ta_2O_5$, $Ae_2O_3$, and the like can also be used as the second insulating film. The thickness of the second insulating film is 0.1 to 3 μm.

The backside electrode can be formed by vapor depositing a metal such as Ae or the same material as used for the transparent electrode in 0.05 to 1 μm thickness, and etching in stripe state or vapor depositing in stripe state.

According to this invention, there can be obtained a thin-film electroluminescent device with good taking out efficiency of the light without causing dielectric breakdown.

The production of a thin-film electroluminescent device is illustrated by way of the following Example.

EXAMPLE 6

A transparent electrode substrate obtained by forming a plurality of stripe-like transparent electrode film (ITO film) on a glass plate was placed in a plasma CVD apparatus and the substrate temperature was made 400° C. The air in the apparatus was removed to $2 \times 10^{-6}$ Torr.

The CVD chamber was filled with oxygen at 0.15 Torr and the treatment was conducted in the plasma for 3 minutes. Then, in the same chamber, a silicon nitride thin film of 2500 Å thick was formed by using a mixture of $SiH_4$, $NH_3$ and $N_2$ at the substrate temperature of 400° C. and a total pressure of 0.8 Torr. After the formation of silicon nitride film, an emission layer of ZnS:Mn was vapor deposited by an electron beam vapor deposition. After the film formation, the heating was conducted at a temperature of 550° C. for one hour, followed by formation of silicon nitride film of 2500 Å by the plasma CVD method. Then, aluminum backside electrodes were formed. The resulting films showed no cracks and the electroluminescence emission of 1200 nt was observed at a threshold value of +30V by a sine wave of 1 KHz.

What is claimed is:

1. A process for forming an insulating film which comprises vapor the depositing a thin film of at least one member selected from a group consisting of silicon nitride, silicon oxide and silicon oxynitride on a transparent electroconductive film formed on a transparent substrate by a plasma chemical vapor deposition method with heating the transparent substrate to a substrate temperature of 350 to 550° C.; said transparent electroconductive film being formed of a material selected from the group consisting of $IN_2O_3(Sn)$, $SnO_2(Sb)$, $Sn_2O(P)$, $SnO_2(Te)$, $SnO_2(W)$, $SnO_2(Ce)$, $SnO_2(F)$, $Cd_2SnO_4$, $Cd_2SnO_2$, CdO, Au, Ag, Cu, Pd, Pt, Ae, Cr, and Rh and said transparent substrate comprising a glass substrate.

2. A process according to claim 1, wherein the transparent substrate having the transparent electroconductive film thereon is pre-treated in an oxygen plasma at the substrate temperature of 200 to 550° C. before the vapor deposition.

3. A process according to claim 1, wherein the transparent substrate having the transparent electroconductive film thereon is pre-treated in an inert gas plasma at the substrate temperature of 200 to 550° C. before the vapor deposition.

4. A process according to claim 1, wherein the transparent substrate having the transparent electroconductive film thereon is vapor deposited by an insulating material in 1 to 10 Å thickness before the vapor deposition of insulating film.

5. A process according to claim 4, wherein the insulating material is at least one member selected from the group consisting of silicon nitride, silicon oxide, silicon oxynitride and alumina.

6. A process for producing a thin-film electroluminescent device which comprises:
   forming a first insulating film of at least one member selected from the group consisting of silicon nitride, silicon oxide and silicon oxynitride on transparent electrodes formed on a transparent substrate by a plasma chemical vapor deposition method with heating the transparent substrate to a substrate temperature of 350 to 550° C., said transparent electroconductive film being formed of a material selected from the group consisting of $In_2O_3(Sn)$, $SnO_2(Sb)$, $Sn_2O(P)$, $SnO_2(Te)$, $SnO_2(W)$, $SnO_2(Ce)$, $SnO_2(F)$, $Cd_2SnO_4$, $Cd_2SnO_2$, CdO, Au, Ag, Cu, Pd, Pt, Ae, Cr, and Rh and said transparent substrate comprising a glass substrate,
   forming an emission layer on the first insulating layer,
   forming a second insulating layer on the emission layer; and
   forming backside electrodes thereon.

7. A process according to claim 6 wherein the transparent substrate having the transparent electrodes thereon is pre-treated in an oxygen plasma at the substrate temperature of 200 to 550° C. before the vapor deposition of the first insulating layer.

8. A process according to claim 6, wherein the transparent substrate having the transparent electrodes thereon is pre-treated in an inert gas plasma at the substrate temperature of 200 to 550° C. before the vapor deposition of the first insulating layer.

9. A process according to claim 6, wherein the transparent substrate having the transparent electrodes thereon is vapor deposited by an insulating material in 1 to 10 Å thickness before the vapor deposition of insulating film.

10. A process according to claim 9, wherein the insulating material is at least one member selected from the group consisting of silicon nitride, silicon oxide, silicon oxynitride and alumina.

11. A process according to claim 1, wherein the thin film is deposited with a thickness of 0.1 to 3μm.

12. A process according to claim 6, wherein the first insulating film is deposited with a thickness of 0.1 to 3μm.

* * * * *